(12) United States Patent
Zhan et al.

(10) Patent No.: US 10,475,958 B2
(45) Date of Patent: Nov. 12, 2019

(54) FLUIDIC ASSEMBLY TOP-CONTACT LED DISK

(71) Applicant: Sharp Laboratories of America, Inc., Camas, WA (US)

(72) Inventors: Changqing Zhan, Vancouver, WA (US); Paul John Schuele, Washougal, WA (US); Mark Albert Crowder, Portland, OR (US); Sean Mathew Garner, Elmira, NY (US); Timothy James Kiczenski, Corning, NY (US)

(73) Assignee: eLux Inc., Vancouver, WA (US)

( * ) Notice: Subject to any disclaimer, the term of this patent is extended or adjusted under 35 U.S.C. 154(b) by 0 days.

(21) Appl. No.: 15/674,339

(22) Filed: Aug. 10, 2017

(65) Prior Publication Data
US 2017/0338379 A1 Nov. 23, 2017

Related U.S. Application Data

(63) Continuation of application No. 14/680,618, filed on Apr. 7, 2015, now Pat. No. 10,115,862, which is a continuation-in-part of application No. 14/530,230, filed on Oct. 31, 2014, now abandoned, which is a continuation-in-part of application No. 14/088,374, filed on Nov. 23, 2013, now Pat. No. 9,018,081, which is a continuation of application No. 13/367,120, filed on Feb. 6, 2012, now Pat. No. 8,648,328, which is a continuation-in-part of application No. 13/337,843, filed on Dec. 27, 2011, now Pat. No. 8,685,774.

(51) Int. Cl.
*H01L 33/20* (2010.01)
*H01L 33/00* (2010.01)
*H01L 25/075* (2006.01)
*H01L 33/32* (2010.01)

(52) U.S. Cl.
CPC .......... *H01L 33/20* (2013.01); *H01L 25/0753* (2013.01); *H01L 33/005* (2013.01); *H01L 33/32* (2013.01); *H01L 2924/0002* (2013.01); *H01L 2933/0033* (2013.01)

(58) Field of Classification Search
CPC ... H01L 33/20; H01L 25/0753; H01L 33/005; H01L 2924/0002; H01L 2933/0033; H01L 33/32
USPC .......................................................... 257/13
See application file for complete search history.

(56) References Cited

U.S. PATENT DOCUMENTS

| | | |
|---|---|---|
| 5,117,749 A | 6/1992 | Bakker |
| 5,696,389 A | 10/1997 | Ishikawa et al. |
| 5,904,545 A | 5/1999 | Smith et al. |

(Continued)

FOREIGN PATENT DOCUMENTS

| | | |
|---|---|---|
| JP | 11-186590 A | 7/1999 |
| JP | 2006-278511 A | 10/2006 |
| JP | 2007-294566 A | 11/2007 |

OTHER PUBLICATIONS

Park, S.I. et al, "Printed Assemblies of Inorganic Light-Emitting Diodes for Deformable and Semitransparent Displays", Science 2009, 325 (5943), 977-981.

(Continued)

*Primary Examiner* — Bo Fan
(74) *Attorney, Agent, or Firm* — HDC IP Law

(57) ABSTRACT

Embodiments are related to systems and methods for forming and using a top-contact disk.

31 Claims, 10 Drawing Sheets

(56) References Cited

U.S. PATENT DOCUMENTS

| | | |
|---|---|---|
| 6,623,579 B1 | 9/2003 | Smith et al. |
| 6,788,376 B2 | 9/2004 | Izumi et al. |
| 6,835,426 B2 | 12/2004 | Duignan |
| 6,864,570 B2 | 3/2005 | Smith |
| 7,116,042 B2 | 10/2006 | Vaartstra |
| 7,198,978 B2 | 4/2007 | Onozawa |
| 7,251,883 B2 | 8/2007 | Nakamura |
| 7,321,159 B2 | 1/2008 | Schatz |
| 7,353,598 B2 | 4/2008 | Craig et al. |
| 7,589,355 B2 | 9/2009 | Tomoda et al. |
| 8,552,436 B2 | 10/2013 | Bibi et al. |
| 9,371,982 B2 | 6/2016 | Zhou |
| 9,534,772 B2 | 1/2017 | Lowenthal et al. |
| 9,574,050 B2 | 2/2017 | Tasaki et al. |
| 9,892,944 B2 | 2/2018 | Schuele et al. |
| 2005/0273739 A1 | 12/2005 | Tohyama |
| 2006/0269689 A1 | 11/2006 | Craig |
| 2007/0031992 A1 | 2/2007 | Schatz |
| 2010/0163895 A1 | 7/2010 | Horie |
| 2011/0133221 A1* | 6/2011 | Choi ............... H01L 33/44 257/88 |
| 2012/0161195 A1* | 6/2012 | Lowenthal ......... H01L 25/048 257/100 |
| 2012/0214290 A1 | 8/2012 | Sugaya |
| 2013/0161584 A1 | 6/2013 | Crowder et al. |
| 2013/0161643 A1 | 6/2013 | Crowder et al. |
| 2014/0077158 A1 | 3/2014 | Crowder et al. |
| 2014/0360554 A1 | 12/2014 | Feist |
| 2015/0155445 A1 | 6/2015 | Zhan et al. |
| 2015/0214430 A1 | 7/2015 | Zhan |

OTHER PUBLICATIONS

Park, S.C. et al, "A First Implementation of an Automated Reel-toReel Fluidic Self-Assembly Machine", Advanced Materials, 2014 26 (34), 5942-5949.

* cited by examiner

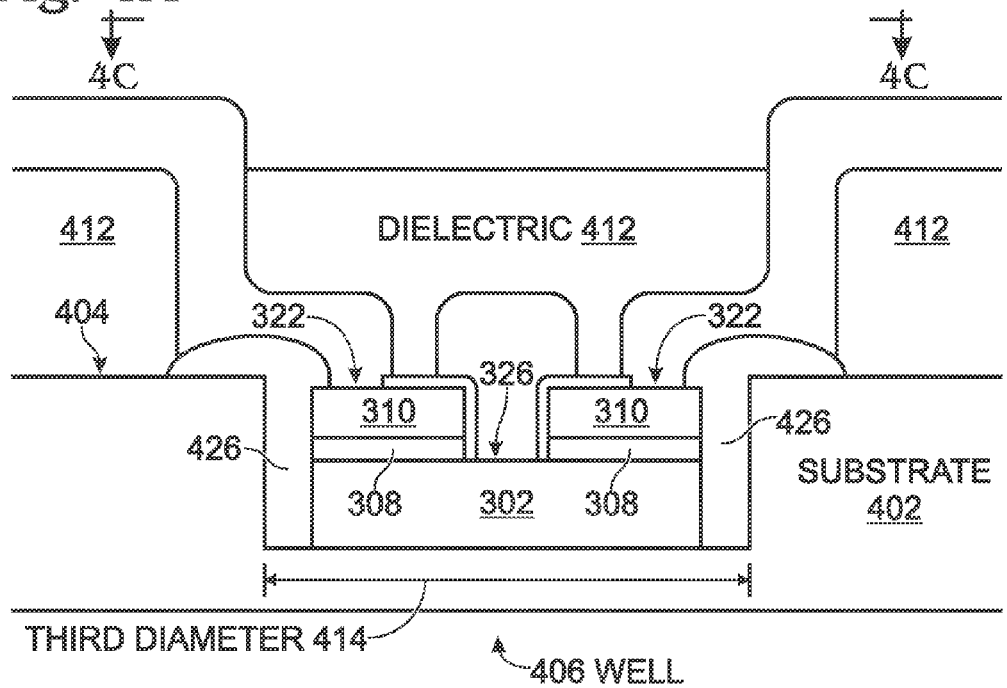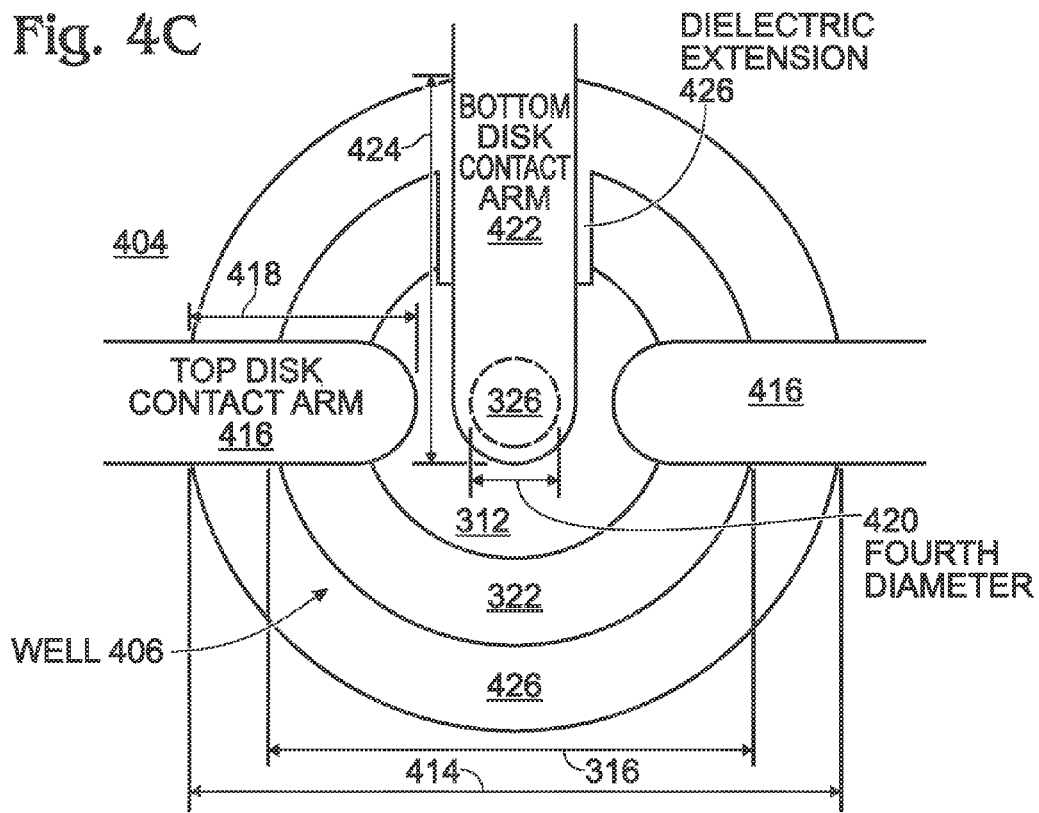

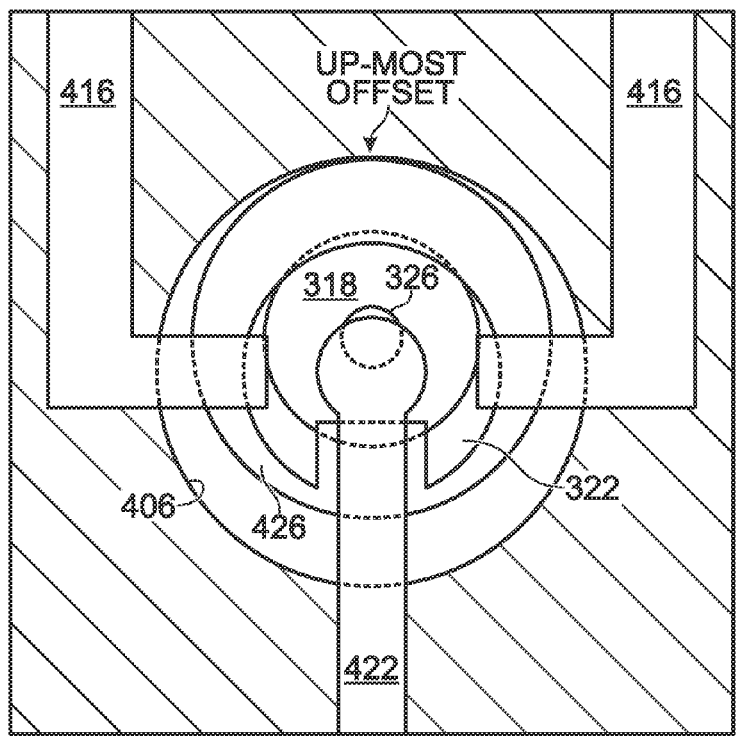
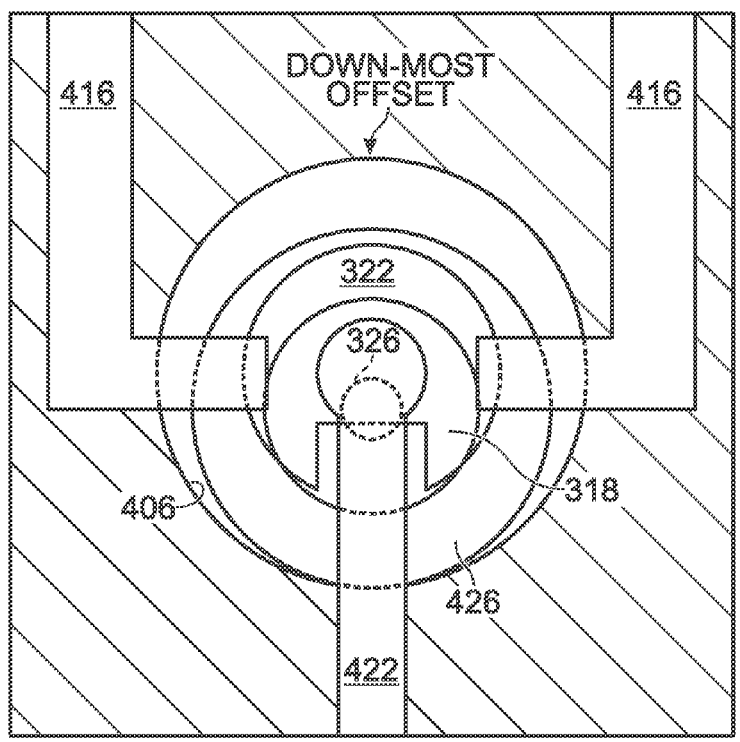

FLUIDIC ASSEMBLY TOP-CONTACT LED DISK

RELATED APPLICATIONS

This application is a continuation of an application entitled, FLUIDIC ASSEMBLY TOP-CONTACT LED DISK, invented by Changqing Zhan et al., Ser. No. 14/680,618, filed Apr. 7, 2015, which is a continuation-in-part of an application entitled, COUNTERBORE POCKET STRUCTURE FOR FLUIDIC ASSEMBLY, invented by Changqing Zhan et al., Ser. No. 14/530,230, filed Oct. 31, 2014;

which is a Continuation-in-part of an application entitled, LIGHT EMITTING DIODE (LED) USING THREE-DIMENSIONAL GALLIUM NITRIDE (GaN) PILLAR STRUCTURES, invented by M. Albert Crowder et al., Ser. No. 14/088,374, filed Nov. 23, 2013;

which is a Continuation of an application entitled, LIGHT EMITTING DIODE (LED) USING THREE-DIMENSIONAL GALLIUM NITRIDE (GaN) PILLAR STRUCTURES WITH PLANAR SURFACES, invented by M. Albert Crowder et al., Ser. No. 13/367,120, filed Feb. 6, 2012;

which is a Continuation-in-Part of an application entitled, METHOD FOR FABRICATING THREE-DIMENSIONAL GALLIUM NITRIDE STRUCTURES WITH PLANAR SURFACES, invented by M. Albert Crowder et al., Ser. No. 13/337,843, filed Dec. 27, 2011. All these applications are incorporated herein by reference.

BACKGROUND

1. Field of the Invention

This invention generally relates to integrated circuit (IC) fabrication and, more particularly, to a fluidic assembly process for the placement of top-contact light emitting diodes on a transparent display substrate.

2. Description of the Related Art

There are three major processes in the fabrication of gallium nitride (GaN) micro light emitting diode (µLED) disks for use in direct emission displays. These processes are: GaN µLED disk fabrication; GaN µLED disk distribution onto a transparent substrate; and, GaN µLED disk interconnection.

Since µLED disks distribute themselves randomly inside transparent substrate placement wells, it makes conventional IC style contact hole opening/metal interconnection design extremely challenging. Extra tolerances are required in the (opaque) interconnections to address this random distribution, resulting in a substantial loss in the emission area fill factor. Further, the complexity required to make these connections results in either a poor yield and/or high cost.

FIGS. 1A and 1B are plan views of a top-contact LED disk located in a substrate well (prior art). In FIG. 1A, $D_d$ denotes the diameter of the LED (e.g., gallium nitride (GaN)) disk, $D_r$ denotes the diameter of the micro-cavity or well into which the µLED disk has been distributed, and $D_p$ denotes the diameter of the p-doped GaN (p-GaN) area, assuming the p-GaN is formed on the top of the disk. Area 100 is the n-GaN contact, where the p-GaN 102 and MQW have been removed by a reactive ion etch (RIE). The inner circular area 102 is the full LED stack with p-GaN on top. A layer of nickel oxide (NiOx)/indium tin oxide (ITO) may be formed on the surface of area 102. In considering typical photolithography misalignment tolerances (up to 2 microns (µm)), the circular area 102 is off the GaN disk center by 2 µm. Since only the area 102 can emit light, the emission area fill factor is only about 70.6%. Nearly 30% of emission area is lost due to the n-GaN opening 100.

FIG. 1B shows the working area for anode end connection 104 (Dpc). Connects made outside of the 24 µm diameter area 104 are likely to result in either a short circuit or open circuit. Conventional metal interconnection to the n-GaN area 102 further reduces the emission area fill factor. Only 31.4% area of the GaN disk will emit light in this example.

FIG. 2 is a partial cross-sectional view of a bottom cathode contact architecture (prior art). This option avoids the significant emission area fill factor loss associated with a conventional top-contact LED disk. A bottom interconnection electrode 200 is first evaporated and patterned on a substrate 202, followed by micro-cavity (well) 204 formation. A thin layer low melting temperature metal film 206 is then coated on the bottom electrode surface inside the micro-cavity 204. The GaN disk 208 (n-GaN 210/p-GaN 212) is then distributed into the micro-cavity 204. After the interlayer dielectric film 214 patterning, the top interconnection electrode 216 is evaporated and patterned to complete the whole process flow.

The process flow described by FIG. 2 is relatively simple. The front-side emission area fill factor can possible reach a maximum of 85% with a carefully top metal wiring design. Major challenges of this flow include the bottom contact yield, uniformity, reliability and repeatability, and the tradeoff between the bottom contact yield and the bottom electrode area if a backside emission opening is needed.

It would be advantageous if a high emission area fill factor could be obtained with a top-contact LED using a simple fabrication process.

SUMMARY

Disclosed herein is a light emitting diode (LED) disk and display design that permit the following advantages: Top connections for both cathode and anode; A interconnection process flow that is at least as simple as the bottom contact flow process; A minimum number of interlayer dielectric (ILD) and metal layers; and, A limited fill factor loss.

The architecture starts with a new LED µdisk structure. Two features help to enable the new approach. One is a center contact opening to the lower (e.g., n-doped) disk of the LED and a dielectric (e.g., tetraethyl orthosilicate (TEOS) SiO.sub.2) isolation pattern in the form of a ring overlying the LED disk, exposing an upper (e.g., n-doped) disk contact region. Comparing to the edge circular opening of the n-GaN disk depicted in FIG. 1A with the same diameter and a 30% fill factor loss, the small center opening of the disk disclosed herein results an emission area fill factor loss as small as 3%. The completed LED disks may be harvested using laser liftoff and formed as an ink in solvent for micro fluidic distribution.

Accordingly, a method is provided for forming a direct emission display. The method provides a transparent substrate with an array of wells or micro-cavities formed in its top surface. A fluid stream is supplied to the substrate top surface comprising a plurality of top-contact light emitting diode (LED) disks. The wells are filled with the LED disks. After forming a dielectric extension to cover a portion of an upper disk contact region, a first array of electrically conductive lines is formed over the substrate top surface to connect with a first (e.g., lower disk) contact of each LED disk, and a second array of electrically conductive lines is formed over the substrate top surface to connect with a second (e.g., upper disk) contact of each LED disk.

Each LED disk is made up of a lower disk of material with either a p-dopant or an n-dopant, having a bottom surface, and a top surface. A multiple quantum well (MQW) disk overlies the lower disk. An upper disk made from a material with the opposite of the dopant used in the lower disk, and has a bottom surface overlying the MQW disk, a top surface, and a first diameter. An electrical insulator disk overlies the upper disk top surface, having a second diameter smaller than the first diameter, exposing an upper disk contact region. A via is formed through the electrical insulator disk, upper disk, and MQW disk, exposing a center contact region of the lower disk top surface.

If the substrate wells have a third diameter, the first array of electrically conductive lines form a pair of opposing top disk contact arms overlying each well to form a connection with the upper disk, with each top-contact arm having a length of x extending over the well, where x greater than (the third diameter-first diameter)/2. Further, if the lower disk contact region has a fourth diameter, the second array of electrically conductive lines form a bottom disk contact arm overlying each well. Each bottom disk contact arm has a length of y extending over the well and dielectric extension, where y is greater than (the third diameter+the fourth diameter)/2.

Additional details of the above-described method, a top-contact LED, and direct emission display made from top-contact LEDs are provided below.

BRIEF DESCRIPTION OF THE FIGURES

FIG. 4A is a partial cross-sectional view, and FIGS. 4B and 4C are plan views of a direct emission display.

FIGS. 7A through 7H are plan views illustrating eight worst-case positions for an LED disk inside a micro-cavity.

DETAILED DESCRIPTION OF SOME EMBODIMENTS

Figure 3A:
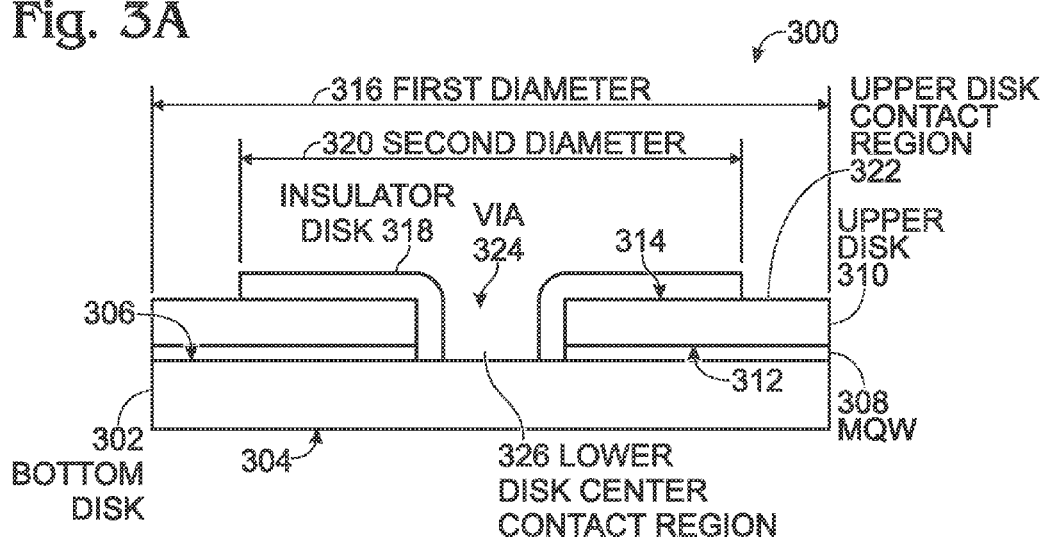
FIGS. 3A and 3B are partial cross-sectional and plan views, respectively, of a top-contact LED.
Figure 3B:
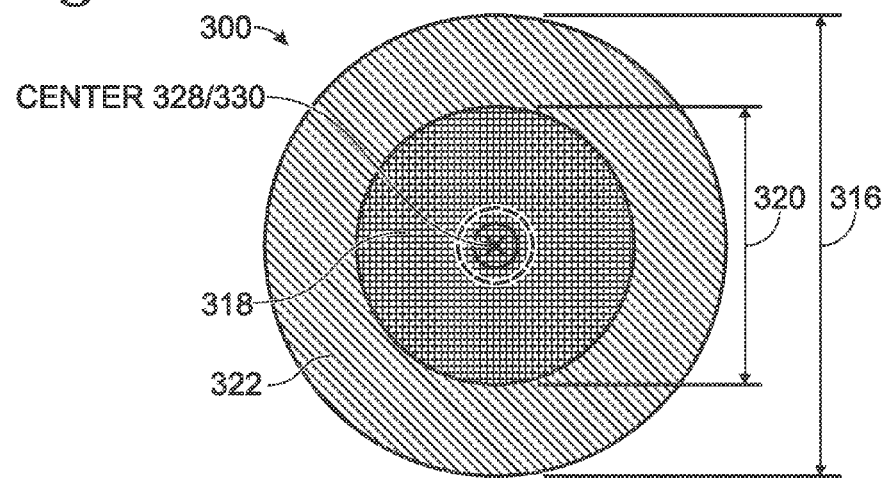

FIGS. 3A and 3B are partial cross-sectional and plan views, respectively, of a top-contact LED. The LED 300 comprises a lower disk 302 comprising a material with either a p-dopant or an n-dopant, having a bottom surface 304 and a top surface 306. A multiple quantum well (MQW) disk 308 overlies the lower disk top surface 306. The MQW layer 308 may typically be a series of quantum well shells (typically 5 layers—e.g., alternating 5 nm of indium gallium nitride (InGaN) with 9 nm of n-doped GaN (n-GaN)) not shown. There may also be an aluminum gallium nitride (AlGaN) electron blocking layer (not shown) between MQW layers and the p-doped disk. The outer shell may be p-doped GaN (Mg doping) about 200 nm thick. A high-brightness blue LED can be formed, or a green LED if a higher indium content is used in the MQW.

An upper disk 310 comprises a material with the opposite dopant that is used in the lower disk. If the lower click 302 is p-doped then the upper disk 310 is n-doped. Likewise, if the lower disk 302 is n-doped, the upper disk 310 is p-doped. The upper disk 310 has a bottom surface 312 overlying the MQW disk 308, a top surface 314, and a first diameter 316. The lower disk may be a material such as p-GaN, p-doped aluminum gallium indium phosphide (p-AlGaInP), n-GaN, or n-AlGaInP. The upper disk 310 could be made of the same materials, but oppositely doped. Note: this is not an exhaustive list of material types.

An electrical insulator disk 318 overlies the upper disk top surface 314, having a second diameter 320 smaller than the first diameter 316, exposing an upper disk contact region 322. Typically, the electrical insulator disk 318 is transparent, and may be a dielectric material such as TEOS silicon dioxide. A via 324 is formed through the electrical insulator disk 318, upper disk 310, and MQW disk 308, exposing a center contact region 326 of the lower disk top surface.

In one aspect as shown, the electrical insulator disk 318 has a center 328 overlying the upper disk center 330. The upper disk contact region 322 is formed around a circumference of the upper disk top surface 314.

Figure 4B:
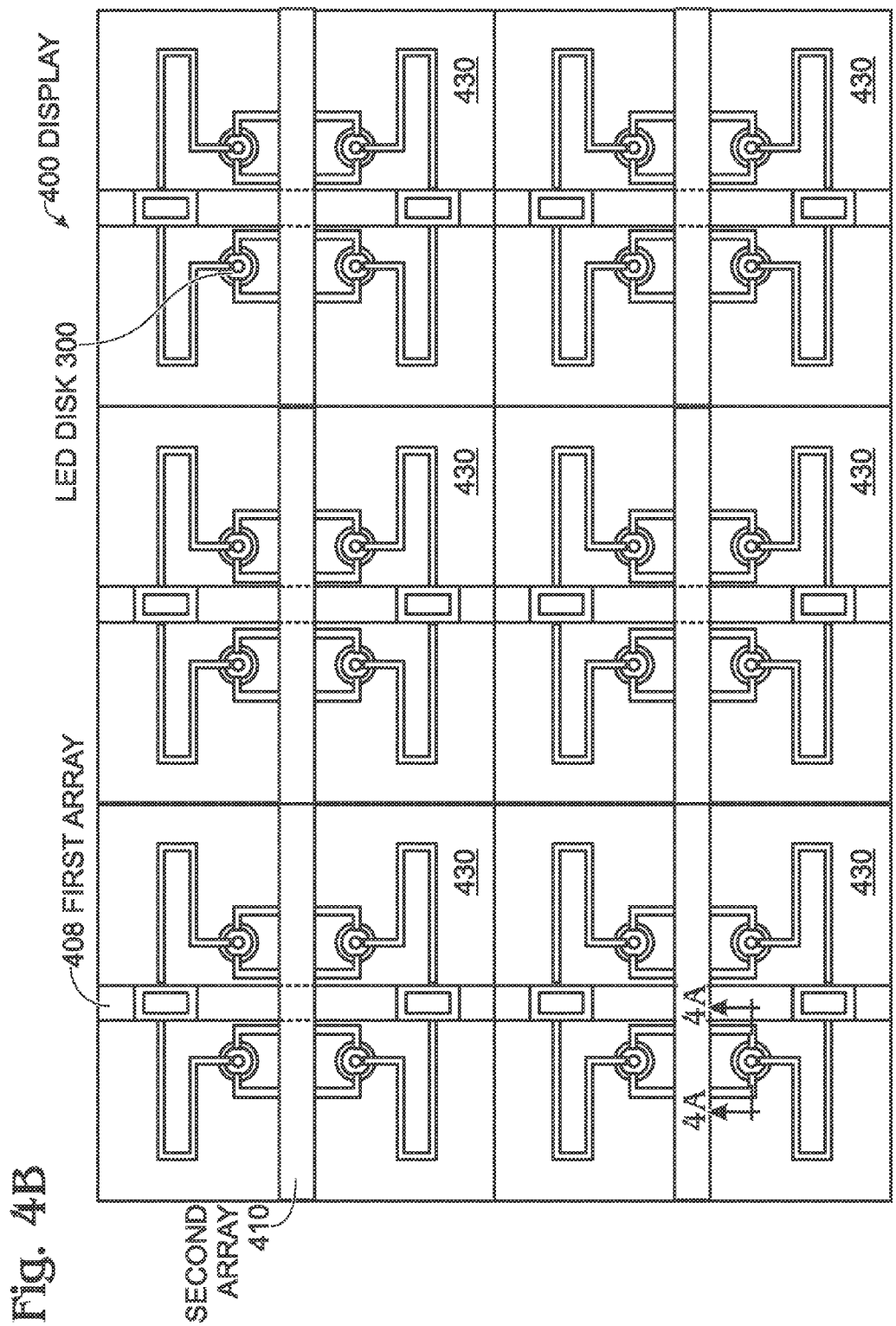

FIG. 4A is a partial cross-sectional view, and FIGS. 4B and 4C are plan views of a direct emission display. FIG. 4B depicts an exemplary layout design of a 2.times.3 LED disk direct emission display pixel array. Each pixel 430 is composed of four LED disks 300 for brightness and redundancy management. The serpentine extensions of the second array 410 wiring are designed for trimming off "dead" LED disks from the array. However, the design is not dependent upon any particular grouping of LEDs or the shape of the wiring interconnects.

As shown in FIG. 4A, the display 400 comprises a transparent substrate 402 with a top surface 404 comprising an array of wells or micro-cavities 406. A top-contact LED 300 is formed in each well 406. Details of the top-contact LED 300 have been provided above in the explanation of FIGS. 3A and 3B, and are not repeated here in the interest of brevity. A first array of electrically conductive lines 408 is connected to the LED lower disk contact regions 326. A second array of electrically conductive lines 410 is connected to the LED upper disk contact regions 322. A dielectric material 412 is interposed between the first array 408 and second array 410 of electrically conductive lines. It should be understood that the overlying order of the conductive arrays is arbitrary. Typically, the electrical insulator disk (see FIG. 3A) and the dielectric 412 are transparent to visible spectrums of light.

Each well 406 has a third diameter 414. The first array of electrically conductive lines forms a pair of opposing top disk contact arms 416 overlying each well 406. Each top disk contact arm 416 has a length 418 of x extending over the well 406, where x greater than (the third diameter 414-first diameter 316)/2. The lower disk contact region 326 has a fourth diameter 420. The second array of electrically conductive lines forms a bottom disk contact arm 422 overlying each well 406. Each bottom disk contact arm 422 has a length 424 of y extending over the well 406 and a dielectric extension 426, where y is greater than (the third diameter 414+the fourth diameter 420)/2. As shown, the bottom disk contact arm 422 is typically orthogonal to both top disk contact arms 416 in each well 406.

Figure 2:
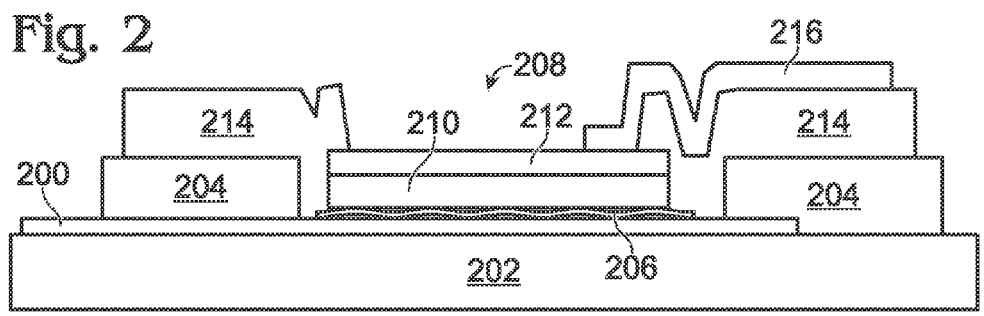
FIG. 2 is a partial cross-sectional view of a bottom cathode contact architecture (prior art).

The fabrication process flow is very similar to the bottom contact option, which has the advantage of simplicity. The fabrication process does not use any more dielectric film or metal film layers than the bottom contact process, and no additional photolithography steps are needed. In fact, the top-contact fabrication process eliminates a low melting temperature metal film coating step (see reference designator 206 of FIG. 2) that is needed for the bottom contact process. In summary, a display fabrication process using the LED disks disclosed herein permits top connections for both cathode and anode of each LED. The interconnection flow is as least as simple as a bottom contact flow process, with a minimum number of ILD and metal layers, and a limited fill factor loss.

Figure 5A:
FIGS. 5A through 5F are partial cross-section views summarizing the major process steps in an exemplary display fabrication process.
Figure 5B:
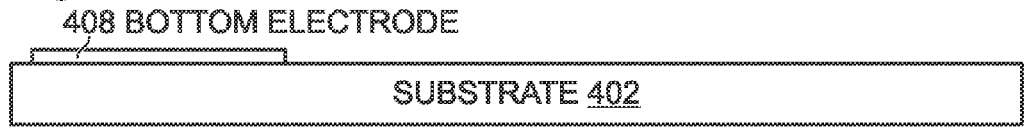
Figure 5C:
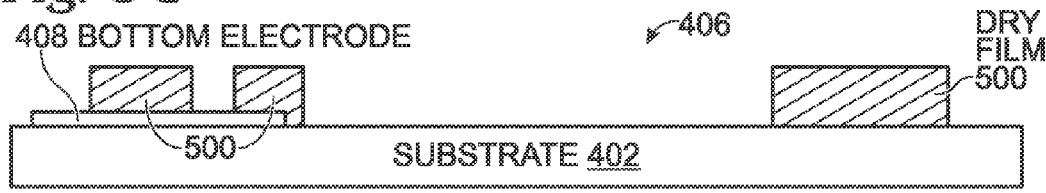
Figure 5D:
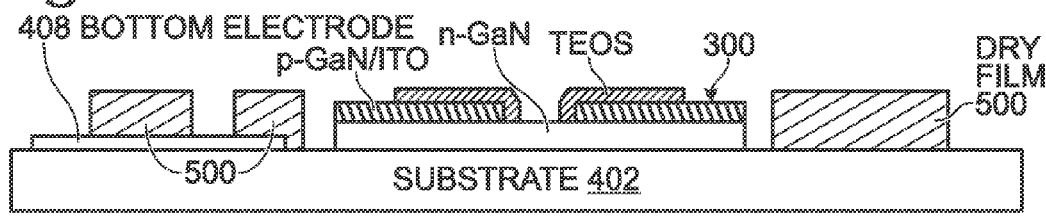
Figure 5E:
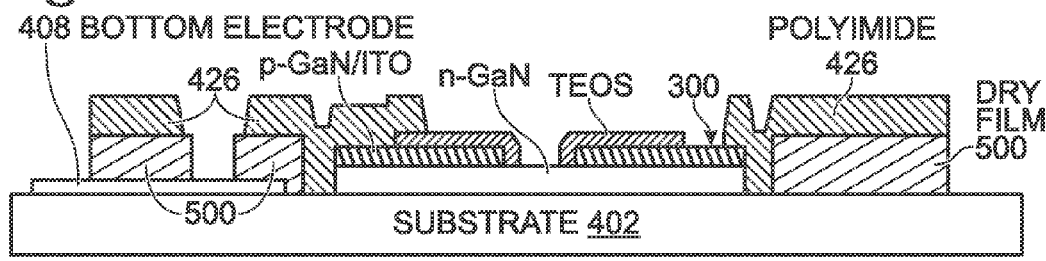
Figure 5F:
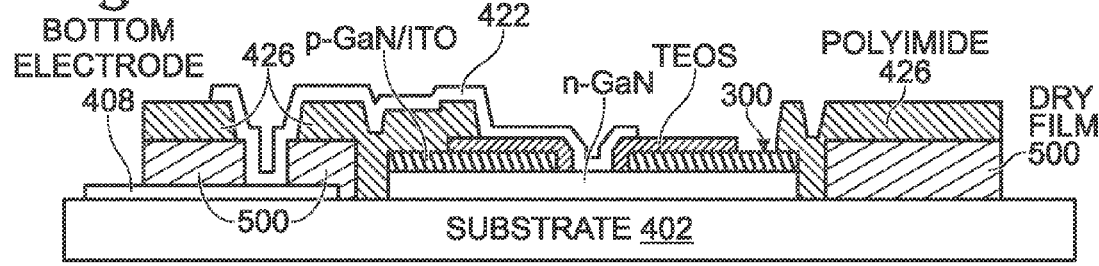

FIGS. 5A through 5F are partial cross-section views summarizing the major process steps in an exemplary display fabrication process. FIG. 5A depicts a transparent substrate and in FIG. 5B the first array of electrical connections 408 (bottom electrode) is formed. Typically, the array is formed using a conformal deposition, followed by patterning. The size of the cell or pixel may, for example, be 500 microns by 500 microns. In FIG. 5C a dry film 500 is deposited and patterned to form a well 406. In other processes, the well may be formed by etching cavities in the substrate top surface. In FIG. 5D the LED disk 300 is situated in the well 406, typically through a fluidic distribution process. In FIG. 5E a dielectric 426 such as polyimide is deposited and patterned around the edges of the LED, also forming the dielectric extension over the upper disk contact region, as shown in FIG. 4C. In FIG. 5F top metallization forms the bottom disk contact arm 422. The top disk contact arms, not shown in the view, may be formed at this time or in a separate step.

Figure 1A:
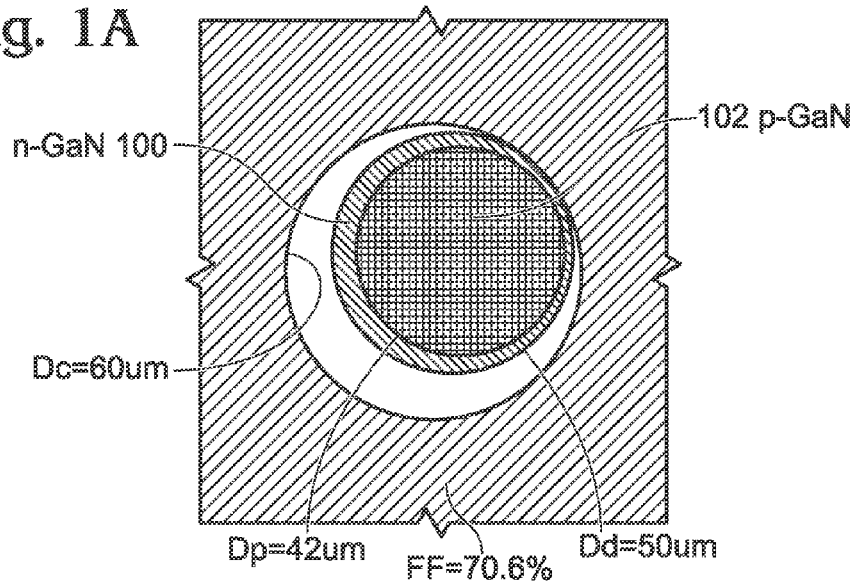
FIGS. 1A and 1B are plan views of a top-contact LED disk located in a substrate well (prior art).
Figure 1B:
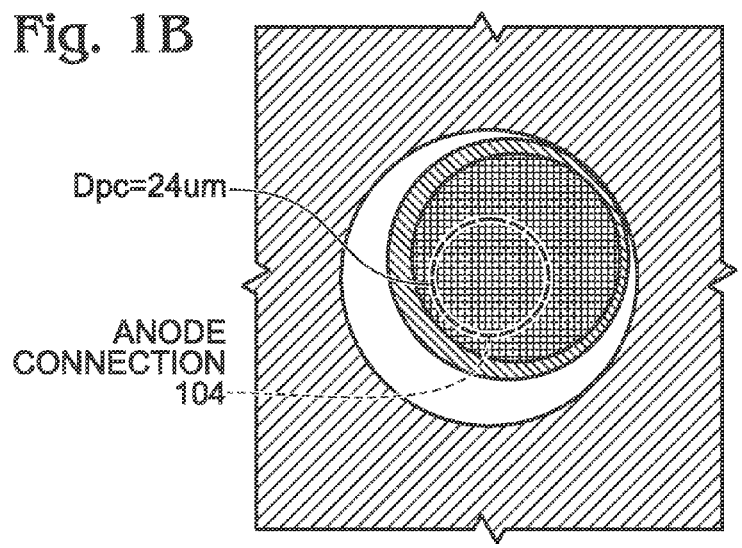
Figure 6:
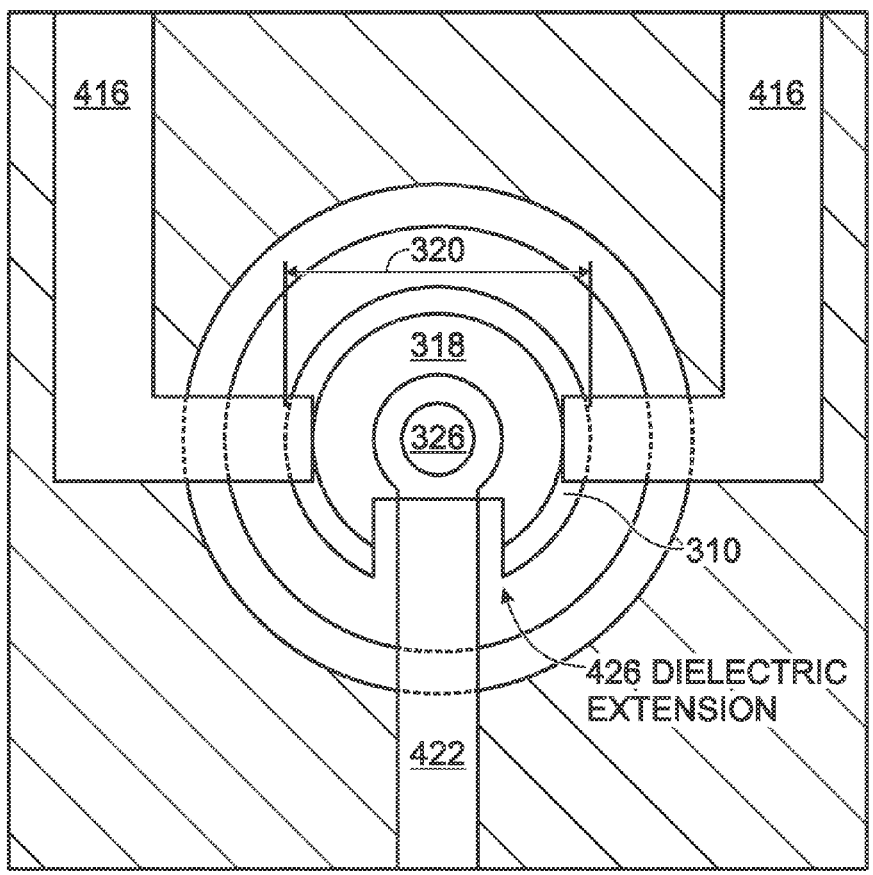
FIG. 6 is another plan view depicting of the LED disk situated is a substrate well.

FIG. 6 is another plan view depicting of the LED disk situated is a substrate well. As an example, the center low disk contact may be 5 um and a TEOS SiO2 insulation disk 318 may have outer (second) diameter 320 of 30 μm. Comparing the edge circular opening to the n-GaN in FIG. 1A (reference designator 100), on the same 50 μm diameter GaN disk with 30% fill factor loss, the small center opening depicted here causes as little as a 3% emission area fill factor loss. The dielectric (e.g., polyimide) extension 426 works together with the built-in TEOS SiO.sub.2 insulation circular disk 318 to form an electrical isolation bridge for a top metal wiring (bottom disk contact arm 422) to reach the contact 326 in the center of the GaN μdisk. The polyimide extension 426 and the SiO.sub.2 ring 318 on the disk are designed so that no matter how the GaN μdisk is distributed inside the micro-cavity, short circuits are prevented while guaranteeing valid contacts to the LED disk.

Two upper disk contact arms 416 are used. If the LED μdisk is located on-center in the micro-cavity, as shown, both arms 416 form a valid contact to the upper disk 310. Even if the LED disk is located off-center, at least one arm 416 contacts the upper disk 310 to guarantee a connection.

Regarding emission area fill factor, for backside emission applications there is no fill factor loss. For front-side emission applications, the loss is just the total non-transparent metal wiring areas, which in this design is about 18%. This new design has an emission area fill factor similar to the bottom contact architecture for front-side emission, and a significantly superior emission area fill factor for backside emission. This enables more freedom in light management by enabling the use of dummy metal patterns on the bottom, or on the top, or on both.

FIGS. 7A through 7H are plan views illustrating eight worst-case positions for an LED disk inside a micro-cavity. In every case, wiring contact is always made with each lower disk contact region 326 of the LED. In every case, the dielectric extension 426 and insulation disk 318 prevent short circuits. In any possible case, at least one upper disk contact arm 416 connects to the upper disk contact region 322 of each LED.

Figure 8:
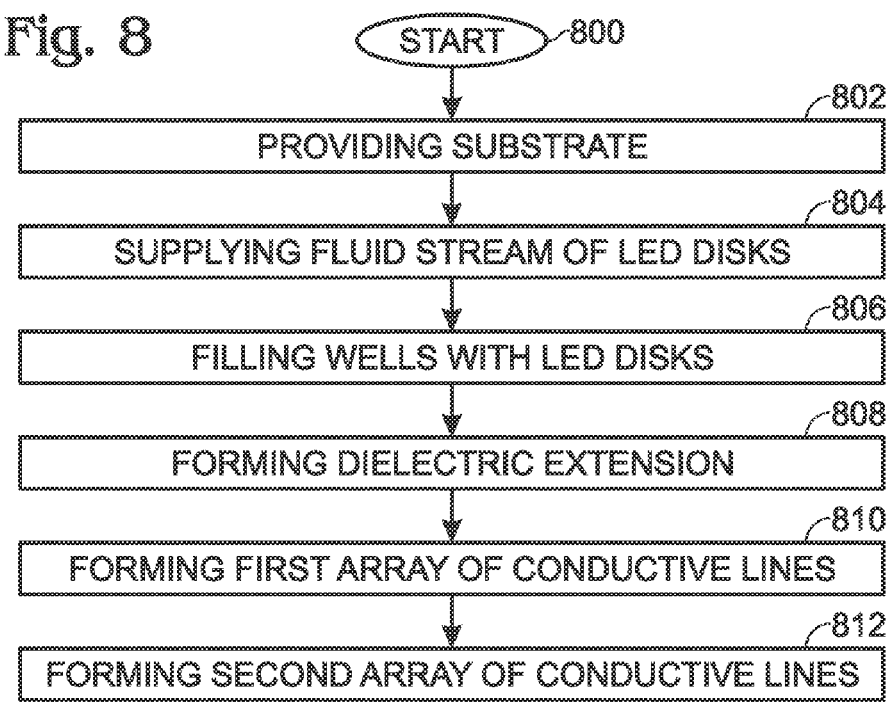
FIG. 8 is a flowchart illustrating a method for forming a direct emission display.
Figure 7C:
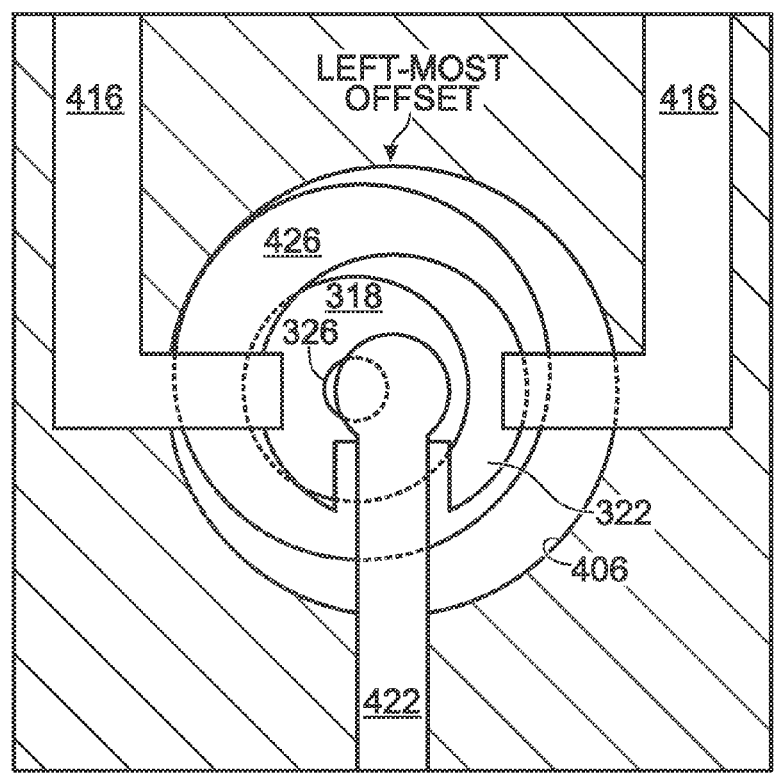
Figure 7D:
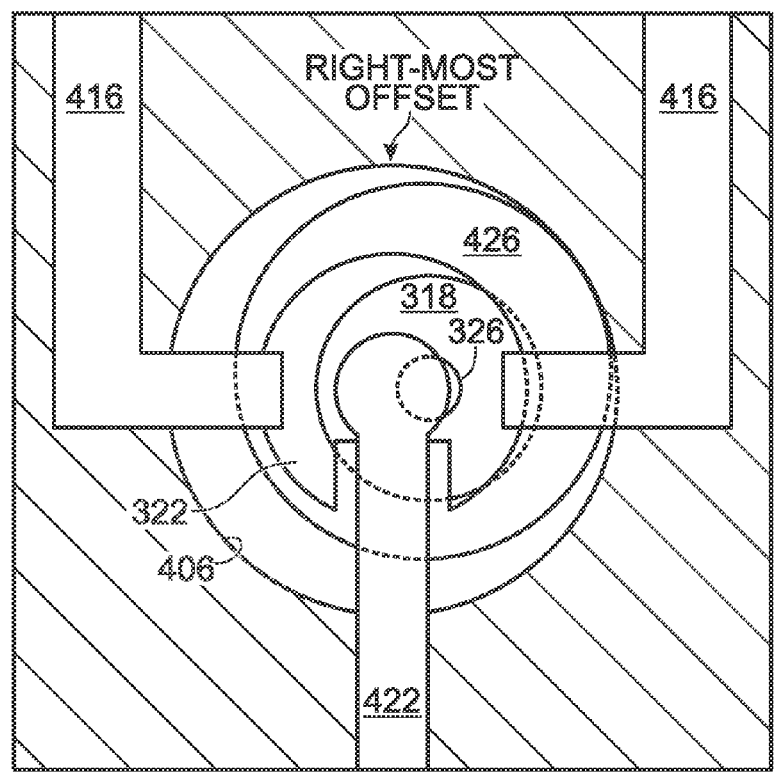
Figure 7E:
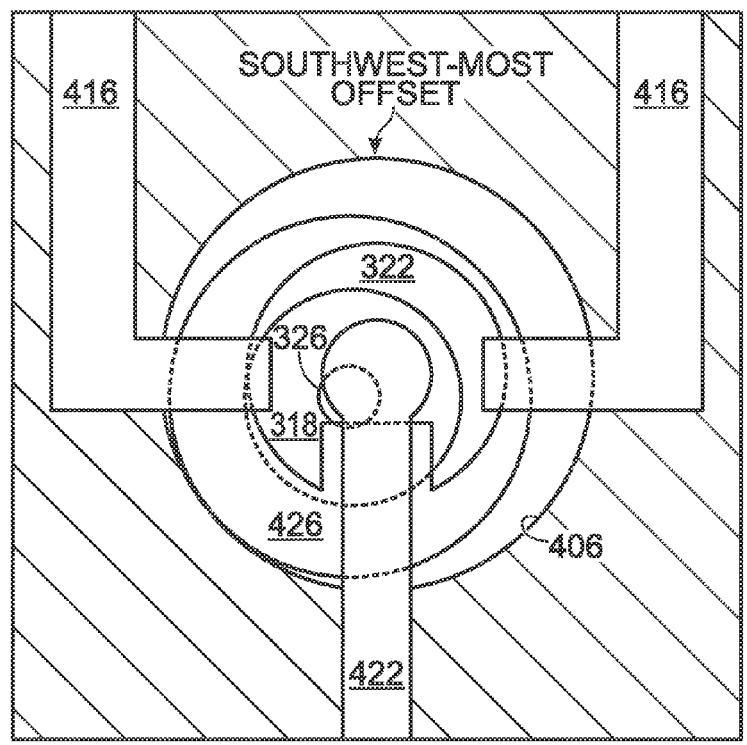
Figure 7F:
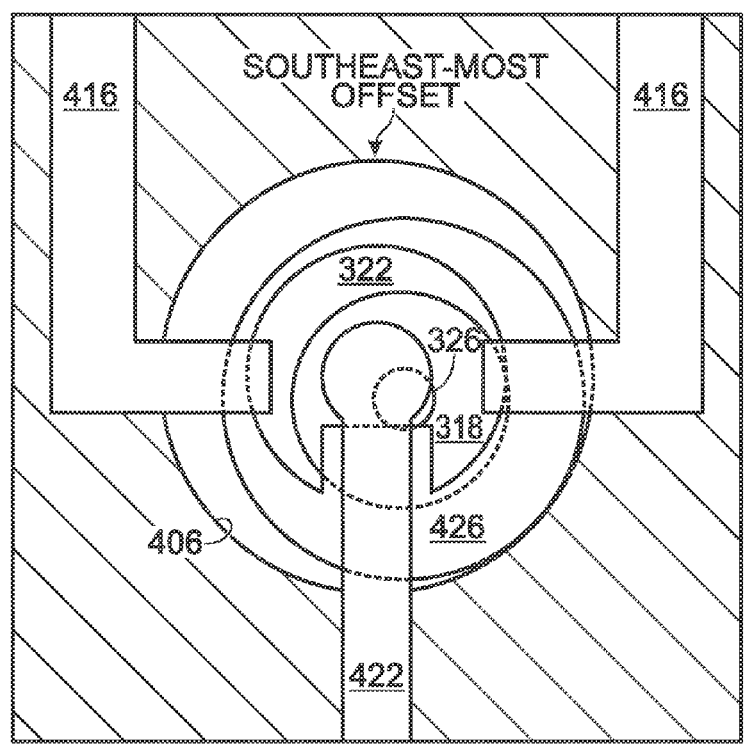
Figure 7G:
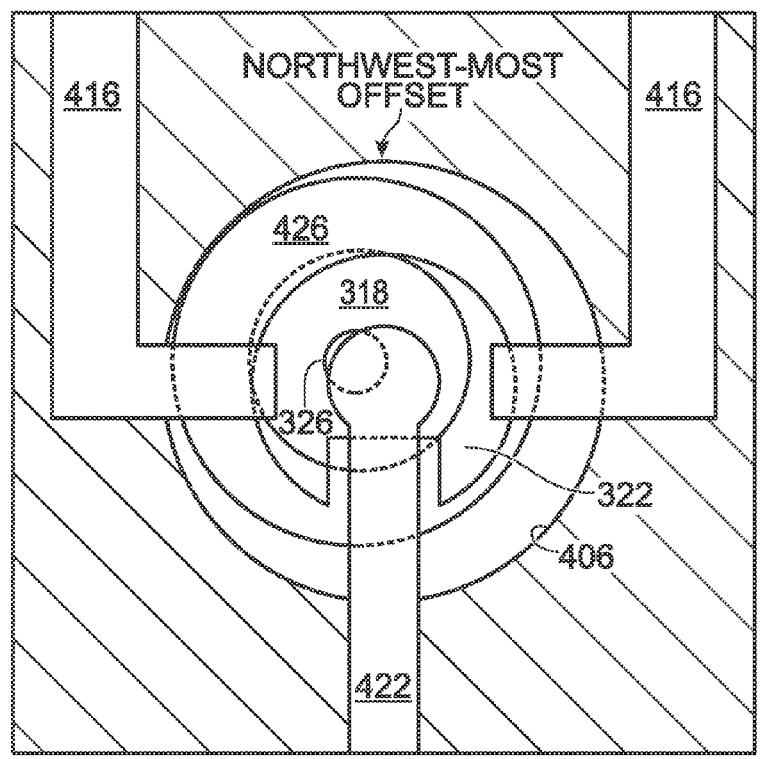
Figure 7H:
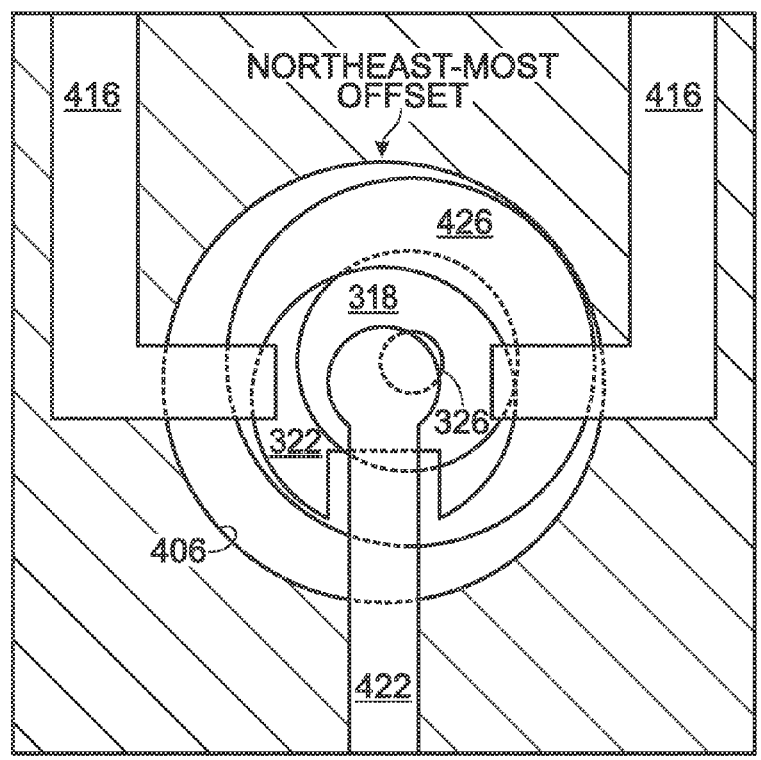

FIG. 8 is a flowchart illustrating a method for forming a direct emission display. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps and can be better appreciated in context of the explanation of FIGS. 3A through 7H. The method starts at Step 800.

Step 802 provides a transparent substrate with an array of wells formed in a top surface. The wells or micro-cavities can be formed by patterned deposition or etching. Step 804 supplies a fluid stream to the substrate top surface comprising a plurality of top-contact LED disks. Otherwise, Step 804 can be enabled using a pick-and-place process. Step 806 fills the wells with the LED disks. Step 808 forms a dielectric extension overlying a portion of an upper disk contact region of the LEDs. Step 810 forms a first array of electrically conductive lines over the substrate top surface to connect with a first contact of each LED disk. Step 812 forms a second array of electrically conductive lines over the substrate top surface to connect with a second contact of each LED disk. Note: Step 812 may be performed before Step 810 in some aspects.

Supplying the LED disks in Step 804 may include supplying LED disks as described above in the description of FIGS. 3A and 3B. That is, the LED disks comprise a lower disk comprising a material with a dopant selected to be either a p-dopant or an n-dopant, having a bottom surface and a top surface. A MQW disk overlies the lower disk. An upper disk comprises a material with the unselected dopant, having a bottom surface that overlies the MQW disk, a top surface, and a first diameter. Specific upper and lower disk materials have been mentioned above. An electrical insulator (e.g. transparent) disk overlies the upper disk top surface, having a second diameter smaller than the first diameter. In one aspect, the electrical insulating disk is centered on the upper disk. A via is formed through the electrical insulator disk, upper disk, and MQW disk, exposing a center contact region of the lower disk top surface.

In one aspect, providing the transparent substrate in Step 802 includes providing a substrate with wells having a third diameter. Then, forming the first array of electrically conductive lines in Step 810 includes forming a pair of opposing top disk contact arms overlying each well. Each top disk contact arm has a length of x extending over the well, where x greater than (the third diameter-first diameter)/2.

In another aspect, supplying the LED disks in Step 804 includes the lower disk contact region having a fourth diameter. Then, forming the second array of electrically conductive lines in Step 812 includes forming a bottom disk contact arm overlying each well. Each bottom disk contact arm has a length of y extending over the well and dielectric extension, where y is greater than (the third diameter+the fourth diameter)/2.

An LED disk, direct emission display, and direct emission display fabrication method have been provided. Examples of particular materials and process steps have been presented to illustrate the invention. However, the invention is not limited to merely these examples. Other variations and embodiments of the invention will occur to those skilled in the art.

What is claimed is:

1. A top-contact light emitting diode (LED), the LED comprising:
   a lower disk having a first surface and a second surface, wherein the lower disk is formed of a first material selected from a group consisting of: a p-doped material, and an n-doped material;
   a multiple quantum well (MQW) having a third surface and a fourth surface, and wherein the fourth surface of the MQW is adjacent the first surface of the lower disk;
   an upper disk having a fifth surface exhibiting and a sixth surface, wherein the fifth surface is opposite the sixth surface, wherein the sixth surface of the upper disk is adjacent the third surface of the MQW, wherein the upper disk is formed of a second material selected from a group consisting of: a p-doped material, and an n-doped material;
   wherein the second material is doped opposite the first material; and
   an electrical insulator formed above a first region of the fifth surface of the upper disk, but is not formed above a second region of the fifth surface of the upper disk, wherein the second region includes an area extending to an outer edge of the fifth surface.

2. The LED of claim 1, wherein the LED further comprises:
   an opening extending through the upper disk and the MQW such that a portion of the first surface of the lower disk is exposed.

3. The LED of claim 2, wherein an inner edge of the opening including an edge of the upper disk and an edge of the MQW is covered by the electrical insulator.

4. The LED of claim 2, wherein the outer edge of the fifth surface of the upper disk over which the electrical insulator is not formed is an upper disk contact region, and wherein the exposed portion of the first surface of the lower disk is a lower disk contact region.

5. The LED of claim 1, wherein the upper disk is a circular disk.

6. The LED of claim 1, wherein the lower disk is a circular disk.

7. The LED of claim 1, wherein the electrical insulator is transparent.

8. The LED of claim 1, wherein the first material is selected from a group consisting of: p-doped gallium nitride (p-GaN), p-doped aluminum gallium indium phosphide (p-AlGaInP), n-doped gallium nitride (n-GaN), and n-doped aluminum gallium indium phosphide (n-AlGaInP).

9. The LED of claim 1, wherein the second material is selected from a group consisting of: p-doped gallium nitride (p-GaN), p-doped aluminum gallium indium phosphide (p-AlGaInP), n-doped gallium nitride (n-GaN), and n-doped aluminum gallium indium phosphide (n-AlGaInP).

10. The LED of claim 1, wherein the first material is the same as the second material.

11. The LED of claim 1, wherein the LED is incorporated into a direct emission display, and wherein the direct emission display comprises:
    a substrate with a top surface comprising a plurality of wells, and wherein the LED is deposited into one of the wells;
    a first electrically conductive line electrically connected to the lower disk; a second electrically conductive line connected to the upper disk; and, a dielectric material interposed between the first electrically conductive line and the second electrically conductive line.

12. The LED of claim 11, wherein the substrate is a transparent substrate.

13. The LED of claim 11, wherein the electrical insulator has a center overlying an upper disk center, wherein a portion of the outer perimeter of the fifth surface of the upper disk that is not covered by the electrical insulator is an upper disk contact region formed around a circumference of the fifth surface of the upper disk; and wherein the display further comprises:
    a dielectric extension formed over a region of the upper disk contact region.

14. The LED of claim 11, wherein a width of the upper disk is a first diameter, wherein the well into which the LED is deposited has a second diameter; and wherein the first electrically conductive line forms a pair of opposing top disk contact arms overlying a top disk contact arm having a length of x extending over the well, where x is greater than (the second diameter−first diameter)/2.

15. The LED of claim 14, wherein the lower disk contact region has a third diameter; and wherein the second electrically conductive line forms a bottom disk contact arm overlying the well into which the LED is deposited, each bottom disk contact arm having a length of y extending over the well into which the LED is deposited and the dielectric extension, where y is greater than (the second diameter+the third diameter)/2.

16. The LED of claim 13, wherein the bottom disk contact arm is orthogonal to both top disk contact arms in the well into which the LED is deposited.

17. A direct emission display comprising:
    a substrate having a substrate surface, wherein a plurality of wells extend into the substrate and below the substrate surface; and
    a plurality of stand alone light emitting diodes (LED) each including a first layer formed of a first semiconductor material, a second layer formed of a second semiconductor material, and a multiple quantum well (MQW) disposed between the first layer and the second layer, wherein the stand alone LEDs are formed apart from the substrate, and after formation are each deposited in a respective one of the plurality of wells in the substrate, wherein each of the plurality of stand alone LEDs includes: a first diode surface and a second diode surface, wherein the second diode surface is opposite the first diode surface, and wherein each of the stand alone LEDs includes an anode connection and a cathode connection on the first diode surface.

18. The direct emission display of claim 17, wherein each of the plurality of wells includes a well bottom and a well sidewall extending from the bottom to the surface of the substrate, and wherein the second diode surface is in contact with well bottom.

19. The direct emission display of claim 17, wherein each of the plurality of wells includes a well bottom and a well sidewall extending from the well bottom to the surface of the substrate, and wherein no conductive material is deposited between the well sidewall and the respective one of the stand alone LEDs deposited in the well.

20. The direct emission display of claim 17, wherein each of the plurality of wells includes a well bottom and a well sidewall extending from the well bottom to the surface of the substrate, and wherein no conductive material is deposited between the well bottom and the respective one of the stand alone LEDs deposited in the well.

21. The direct emission display of claim 17, wherein the first layer has the second diode surface and a first layer surface, wherein the first layer surface is opposite the second diode surface, wherein the first layer surface is substantially planar, and wherein the first diode surface includes a portion of the first layer corresponding to a first electrical contact.

22. The direct emission display of claim 21, wherein the MQW has a first MQW surface and a second MQW surface, wherein the first MQW surface is adjacent the lower layer surface, and wherein the first electrical contact is on a plane where the first MQW surface and the lower layer surface are in contact.

23. The direct emission display of claim 17, wherein the first diode surface is non-planar.

24. The direct emission display of claim 17, wherein the first layer has the second diode surface and a seventh surface, wherein the seventh surface is opposite the second diode surface, wherein the seventh surface is substantially planar, and wherein the first diode surface includes a portion of the seventh surface corresponding to a first electrical contact;
the MQW has a third surface and a fourth surface, and wherein the third surface of the MQW is adjacent the seventh surface of the first layer;
an second layer having a fifth surface and a sixth surface, wherein the fifth surface is opposite the sixth surface, wherein the fifth surface of the second layer is adjacent the fourth surface of the MQW, and wherein the first diode surface includes a portion of the sixth surface corresponding to a second electrical contact; and
wherein the first electrical contact is one of the cathode connection or the anode connection, and the second electrical contact is the other of the cathode connection or the anode connection.

25. The direct emission display of claim 17, the direct emission display further comprising:
a first electrically conductive material electrically connecting the anode connection of a first of the plurality of stand alone LEDs to the anode connection of a second of the plurality of stand alone LEDs; and
a second electrically conductive material electrically connecting the cathode connection of a third of the plurality of stand alone LEDs to the cathode connection of a fourth of the plurality of stand alone LEDs.

26. The direct emission display of claim 17, wherein the direct emission display is a passive display.

27. The direct emission display of claim 17, wherein the direct emission display is an active display.

28. The direct emission display of claim 17, wherein the first layer comprises a material with a first dopant selected from a group consisting of: a p-dopant, and an n-dopant; wherein the lower disk has a bottom surface and a top surface;
the second layer comprises a material with a second dopant, wherein the second dopant is opposite the first dopant;
each of the stand alone LEDs further comprising:
an electrical insulator overlying a first region of the second layer top surface, but not overlying a second region that extends to an outer edge of the second layer upper disk top surface to leave a second layer contact region; and
a via formed through the electrical insulator, second layer, and MQW, exposing a center contact region of the first layer, wherein the second layer contact region and the center contact region are part of the first diode surface.

29. The direct emission display of claim 28, wherein the electrical insulator disk and dielectric are transparent.

30. The direct emission display of claim 28, wherein the lower disk is made of a material selected from a group consisting of: p-doped gallium nitride (p-GaN), p-doped aluminum gallium indium phosphide (p-AlGaInP), n-doped gallium nitride (n-GaN), and n-doped aluminum gallium indium phosphide (n-AlGaInP).

31. A direct emission display, the display comprising:
a plurality of light emitting diodes (LED), wherein each of the plurality of LEDs includes:
a lower layer having a first surface and a second surface, wherein the second surface is opposite the first surface;
a multiple quantum well (MQW) having a third surface and a fourth surface, and wherein the third surface of the MQW is adjacent the second surface of the lower layer;
an upper layer having a fifth surface and a sixth surface, wherein the fifth surface is opposite the sixth surface, wherein the fifth surface of the upper layer is adjacent the 4th surface of the MQW;
wherein an LED contact layer includes both a portion of the sixth surface of the upper layer corresponding to a first electrical contact and a portion of the second layer of the lower layer corresponding to a second electrical contact; and
a substrate having a seventh surface and an eighth surface, wherein the eight surface is opposite the seventh surface, wherein the plurality of LEDs are each deposited into a respective one of a plurality of wells extending into the seventh surface of the substrate such that the first electrical contact and the second electrical contact are accessible from the seventh surface of the substrate, wherein each of the plurality of wells includes a well bottom and a well sidewall extending from the well bottom to the surface of the substrate, and wherein no conductive material is deposited between the well sidewall and the respective one of the LEDs deposited in the well.

* * * * *